United States Patent
Burr et al.

(10) Patent No.: US 7,920,406 B2
(45) Date of Patent: *Apr. 5, 2011

(54) INCREASING EFFECTIVE TRANSISTOR WIDTH IN MEMORY ARRAYS WITH DUAL BITLINES

(75) Inventors: Geoffrey W. Burr, Cupertino, CA (US); Kailash Gopalakrishnan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 196 days.

This patent is subject to a terminal disclaimer.

(21) Appl. No.: 12/180,586

(22) Filed: Jul. 28, 2008

(65) Prior Publication Data
US 2008/0280401 A1    Nov. 13, 2008

Related U.S. Application Data

(63) Continuation of application No. 11/686,415, filed on Mar. 15, 2007, now Pat. No. 7,447,062.

(51) Int. Cl.
*G11C 11/00*    (2006.01)
*G11C 5/06*    (2006.01)

(52) U.S. Cl. .......... 365/148; 365/242; 365/243; 365/63; 365/72

(58) Field of Classification Search .......... 365/163, 365/148, 63, 72, 243, 158, 171, 173, 71, 365/66, 51, 242
See application file for complete search history.

(56) References Cited

U.S. PATENT DOCUMENTS

| | | | |
|---|---|---|---|
| 5,912,839 A | 6/1999 | Ovshinsky et al. | |
| 6,067,249 A | 5/2000 | Lee et al. | |
| 6,356,477 B1 | 3/2002 | Tran | |
| 6,590,807 B2 * | 7/2003 | Lowrey | 365/175 |
| 6,606,263 B1 | 8/2003 | Tang | |
| 6,967,865 B2 * | 11/2005 | Lee | 365/163 |
| 7,154,798 B2 | 12/2006 | Lin et al. | |
| 7,447,062 B2 * | 11/2008 | Burr et al. | 365/163 |
| 7,499,315 B2 * | 3/2009 | Lowrey et al. | 365/163 |
| 2006/0067112 A1 | 3/2006 | Ferrant et al. | |
| 2006/0209585 A1 * | 9/2006 | Tanizaki et al. | 365/148 |
| 2007/0252219 A1 * | 11/2007 | Taguchi | 257/379 |

* cited by examiner

*Primary Examiner* — J. H. Hur
(74) *Attorney, Agent, or Firm* — Cantor Colburn LLP

(57) ABSTRACT

A method for forming a memory structure, includes: forming an array of individual memory cells arranged in a network of bit lines and word lines, each individual memory cell further comprising a resistive memory device that is capable of being programmed to a plurality of resistance states, each of the resistive memory devices coupled to one of the bit lines at a first end thereof; configuring a rectifying element in series with each of the resistive memory devices at a second end thereof; configuring an access transistor associated with each of the individual memory cells, the access transistors activated by a signal applied to a corresponding one of the word lines, with each access transistor connected in series with a corresponding rectifying element; and forming a common connection configured to short neighboring rectifying devices together along a word line direction, in groups of two or more.

15 Claims, 5 Drawing Sheets

INCREASING EFFECTIVE TRANSISTOR WIDTH IN MEMORY ARRAYS WITH DUAL BITLINES

CROSS-REFERENCE TO RELATED APPLICATIONS

This non-provisional U.S. Patent Application is a continuation of U.S. patent application Ser. No. 11/686,415, now, U.S. Pat. No. 7,447,063, filed Mar. 15, 2007 and is assigned to the present assignee.

BACKGROUND OF THE INVENTION

1. Field of the Invention

This invention relates generally to solid-state nonvolatile memories, and more particularly to providing a method for increasing effective transistor width in memory arrays with dual bitlines.

2. Description of the Background

Solid-state nonvolatile memories can be formed based on sensing resistance states. One such example is a phase change memory device that utilizes phase change materials to form individual memory cells/elements. Phase change materials can be electrically switched between a generally amorphous, high resistance state and a generally crystalline, low resistance state. The memory elements, depending on the application, can be electrically switched between generally amorphous and generally crystalline local orders or between different detectable states of local order across the entire spectrum between completely amorphous and completely crystalline states. Other resistive memory candidates, such as ferroelectric, perovskite, solid electrolytes, or molecular switches, operate in a similar manner, switching between two distinct resistance states upon application of a significant current and/or voltage.

One of the limiting factors in the density with which a non-volatile memory can be fabricated is not the size of the programmable memory element, but the size of the access transistor or other access device co-located with each memory element. The limitation of the access device stems from the scaling of the maximum current supplied by the access device with its size, and thus memory element configurations that can reduce the amount of current required (total power required) in order to switch the memory element are key design considerations. Thus there is a need in the art of memory design for access schemes that maximize current supplied to a memory element, while maintaining unique programming and read access to individual memory elements.

SUMMARY OF THE INVENTION

Embodiments of the present invention provide a method for forming a memory structure, the method includes: forming an array of individual memory cells arranged in a network of bit lines and word lines, each individual memory cell further comprising a resistive memory device that is capable of being programmed to a plurality of resistance states, each of the resistive memory devices coupled to one of the bit lines at a first end thereof; configuring a rectifying element in series with each of the resistive memory devices at a second end thereof, configuring an access transistor associated with each of the individual memory cells, the access transistors activated by a signal applied to a corresponding one of the word lines, with each access transistor connected in series with a corresponding rectifying element; and forming a common connection configured to short neighboring access transistor devices together along a word line direction, in groups of two or more.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, a solution is technically achieved in which the effective maximum current supplied to a memory element in a nonvolatile memory array is increased by pooling transistor drive currents while still maintaining unique programming and read access to each of the memory elements in the memory array.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF SPECIFIC EMBODIMENTS

Embodiments of the present invention provide a structure and method in which the effective maximum current supplied to a memory element in a nonvolatile memory array is increased by pooling transistor drive currents while still maintaining unique programming and read access to each of the memory elements in the memory array.

Figure 1:
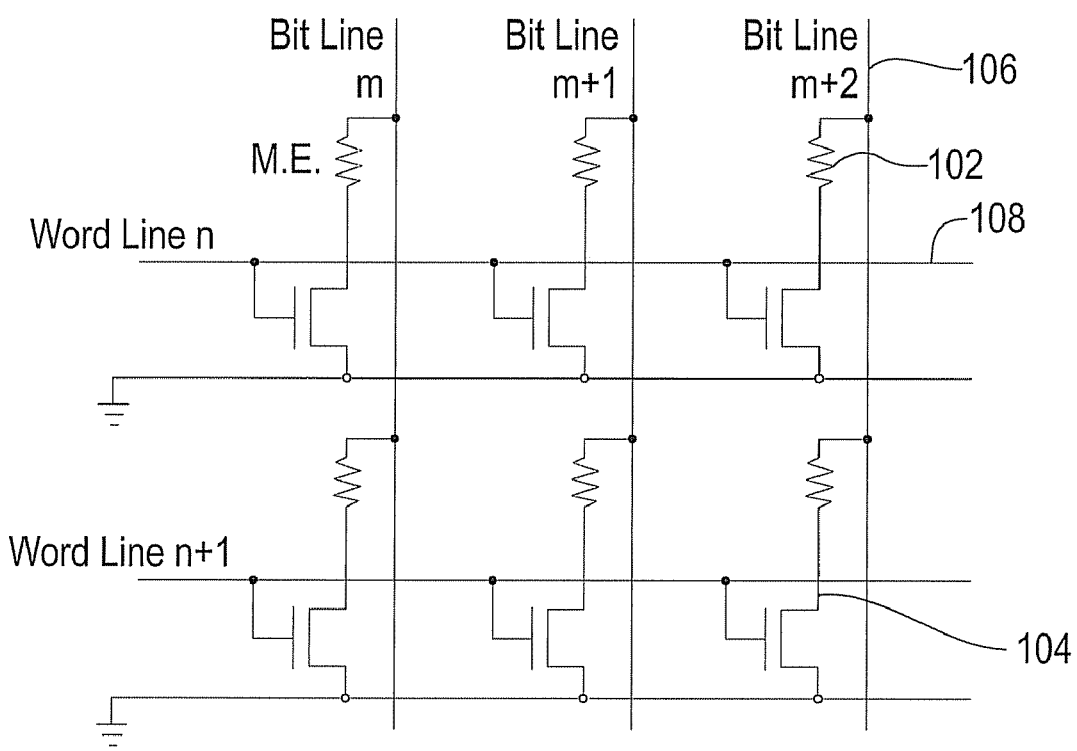
FIG. 1 is a schematic perspective partial view of a nonvolatile memory array with resistive memory elements.

FIG. 1 is a prior art schematic perspective partial view of a nonvolatile phase change memory array 100 with resistive memory elements 102, and access transistors 104. The non-volatile array 100 is tied together with bit lines 106 and word lines 108, which act to address and control the individual resistive memory elements 102.

Figure 2:
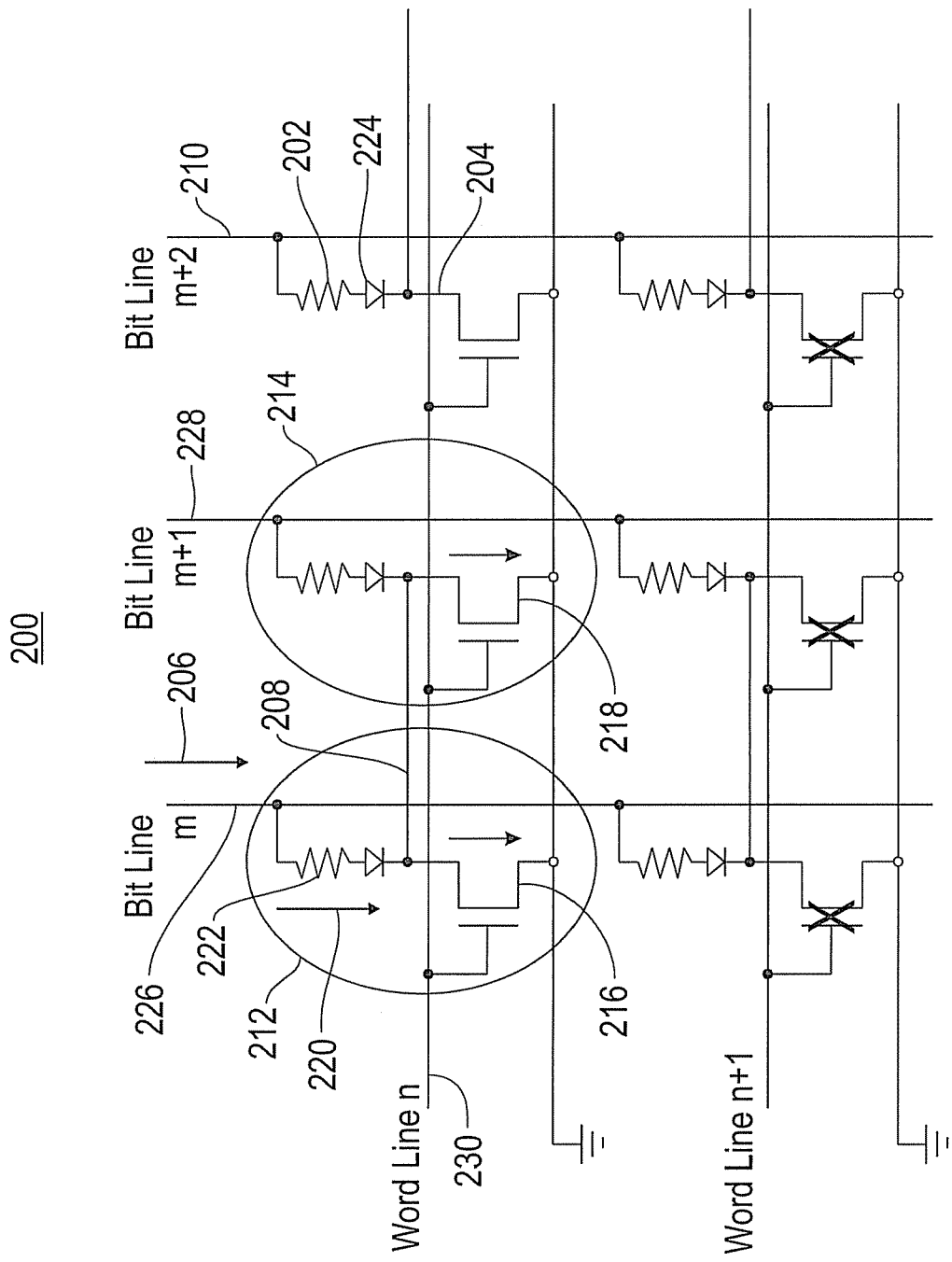
FIG. 2 is a schematic perspective partial view of a nonvolatile memory array with resistive memory elements with pooled transistor drive currents achieved by shorting two neighboring cells on different bit lines according to an embodiment of the present invention.

FIG. 2 is a schematic perspective partial view of a nonvolatile memory array 200 with resistive memory elements 202 with pooled transistor drive current 206 achieved by shorting with electrical connection 208 two neighboring cells (212, 214) on different bit lines (226, 228) according to an embodiment of the present invention. The shorting together of the adjacent cells (212, 214) allows the use of both access transistors (216, 218) to supply programming current 220 to the memory element 222 of the selected cell 212. In the context of a memory array 200 composed of phase change memory elements 222, the current 220 is utilized during the RESET step, where sufficient programming current 220 needs to be injected in order to "melt" the phase change material. A series of diodes 224 are configured within the memory cells of the memory array 200, in order to continue to be able to address individual memory cells even with the shorting of adjacent cells. The diodes 224 are in series between the memory elements 202 and the drains of the access transistors 204.

Even though only every other bit line may be used for simultaneous addressing (as the structure is configured to pool transistor drive currents), every memory element can still be individually addressed. To access the memory element 222 at bit line m (226) and word line n (230), the word line n (230) is set to a suitable gate voltage Vg and all other word lines are set to 0. In the case of the non-pooled transistor drive currents (FIG. 1), measurements of the sense current or driving the recording current uniquely on each bit line can be realized. However, here only bit lines m, m+2, m+4, etc. can be utilized for data access, and the bit lines m+1, m+3, m+5, etc. are set to a low voltage (sufficient to turn the m+1 diode off regardless of the voltage on the shorted collector of the two transistors). If the diode is ideal, then the current 220 going down bit line m (226) will pass through the memory element 222 at (n, m) as desired (see FIG. 2). Since the two transistors (216, 218) of the adjacent cells (212, 214) can share this current for an increased drive current 206, or the two transistors can be merged into one wide transistor.

Figure 3:
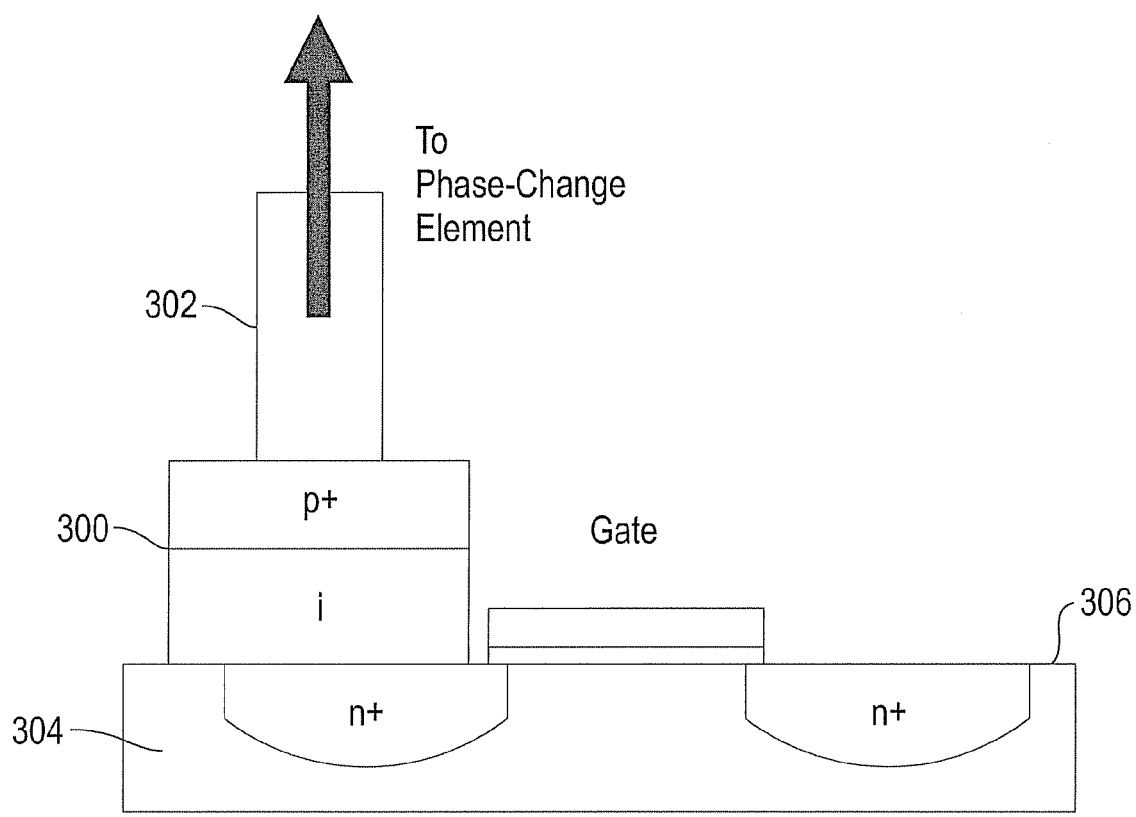
FIG. 3 is a cross sectional view of an access diode according to an embodiment of the present invention.

FIG. 3 is a cross sectional view of an access diode configuration according to an embodiment of the present invention. The access diode 300 sits at the base of a memory element stack 302, and shares the n+ implant 304 of the access transistor 306. However, where the p+ portion is formed from polysilicon, the performance of the diode could potentially be limited. The access diode should be able to pass twice the current of the access transistor 306. For example, in the case of a 100 mA total memory element current in the 50 nm node, a target current density of $5 \times 10^6$ A/cm$^2$ is selected for by the access diode. Thus, Schottky diodes may represent one suitable example of a diode capable of such current density performance.

Figure 4:
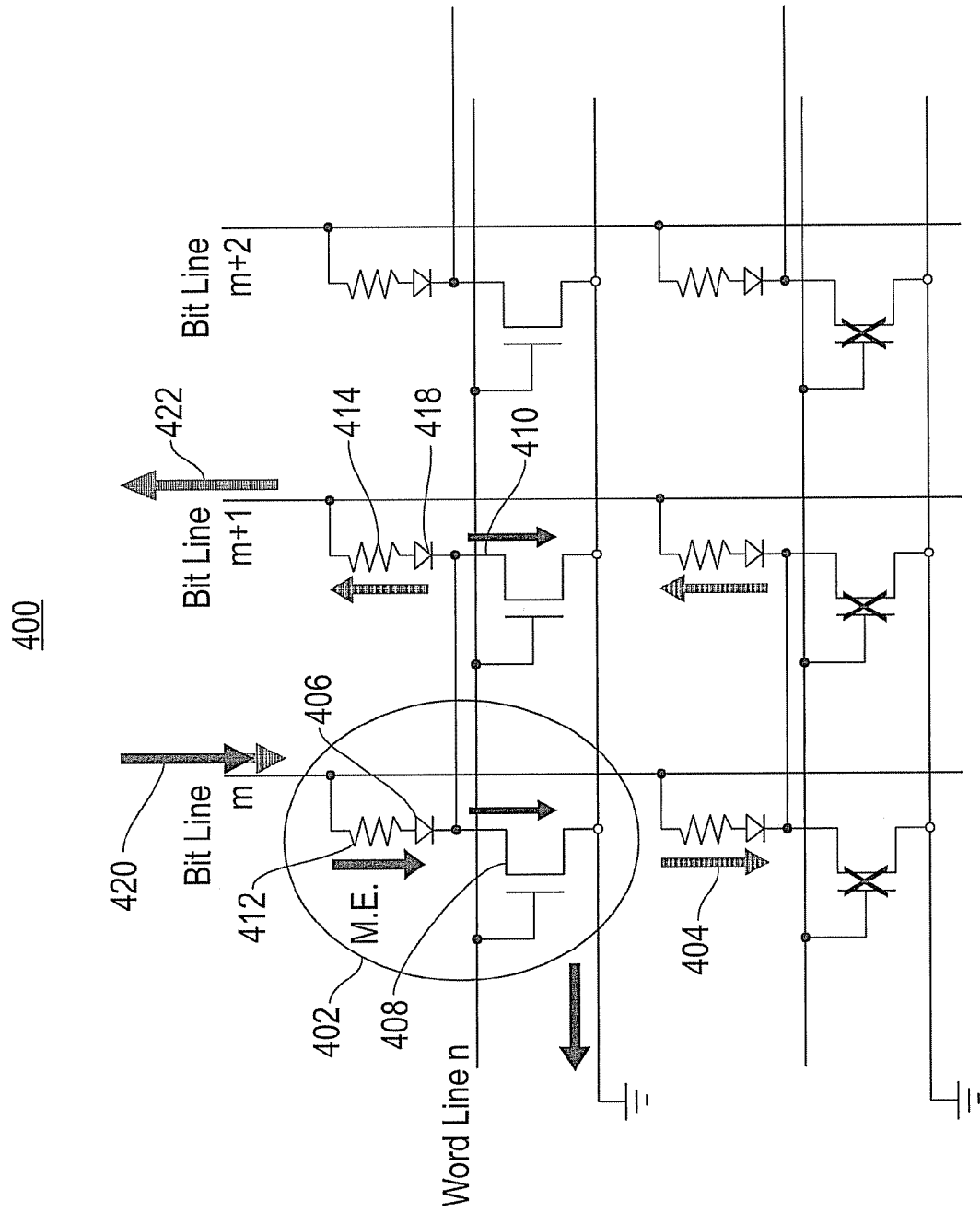
FIG. 4 is a schematic perspective partial view of a nonvolatile memory array with resistive memory elements with pooled transistor drive currents that accounts for leakage currents introduced by the access diode according to an embodiment of the present invention.

Even if the access diode has a moderate leakage current, it is still possible to access individual memory cells. In FIG. 4, the memory cell 402 in memory array 400 is read at (m, n). Ideally, measuring the current $I_{out}$ 420 would identify the state of the memory element at (m, n). However with leakage current 404 in the access diode 406, and each pair of shorted devices (408, 410) on the same bit line m, but addressed by the other word lines (n+1, etc.), represents a path for leakage current. Each path includes 2 memory elements in series (412, 414), a forward-biased access diode 406, and a reverse-biased access diode 418, since bit lines m+1, m+3, etc. are assumed to be held low. However, all of the extra leakage current within Iout 420 returns on bit line m+1 as $I_{return}$ 422. Thus, by measuring the current differential $I_{out}-I_{return}$, the state of the memory element of interest can be determined, even in the presence of some amount of leakage.

Figure 5:
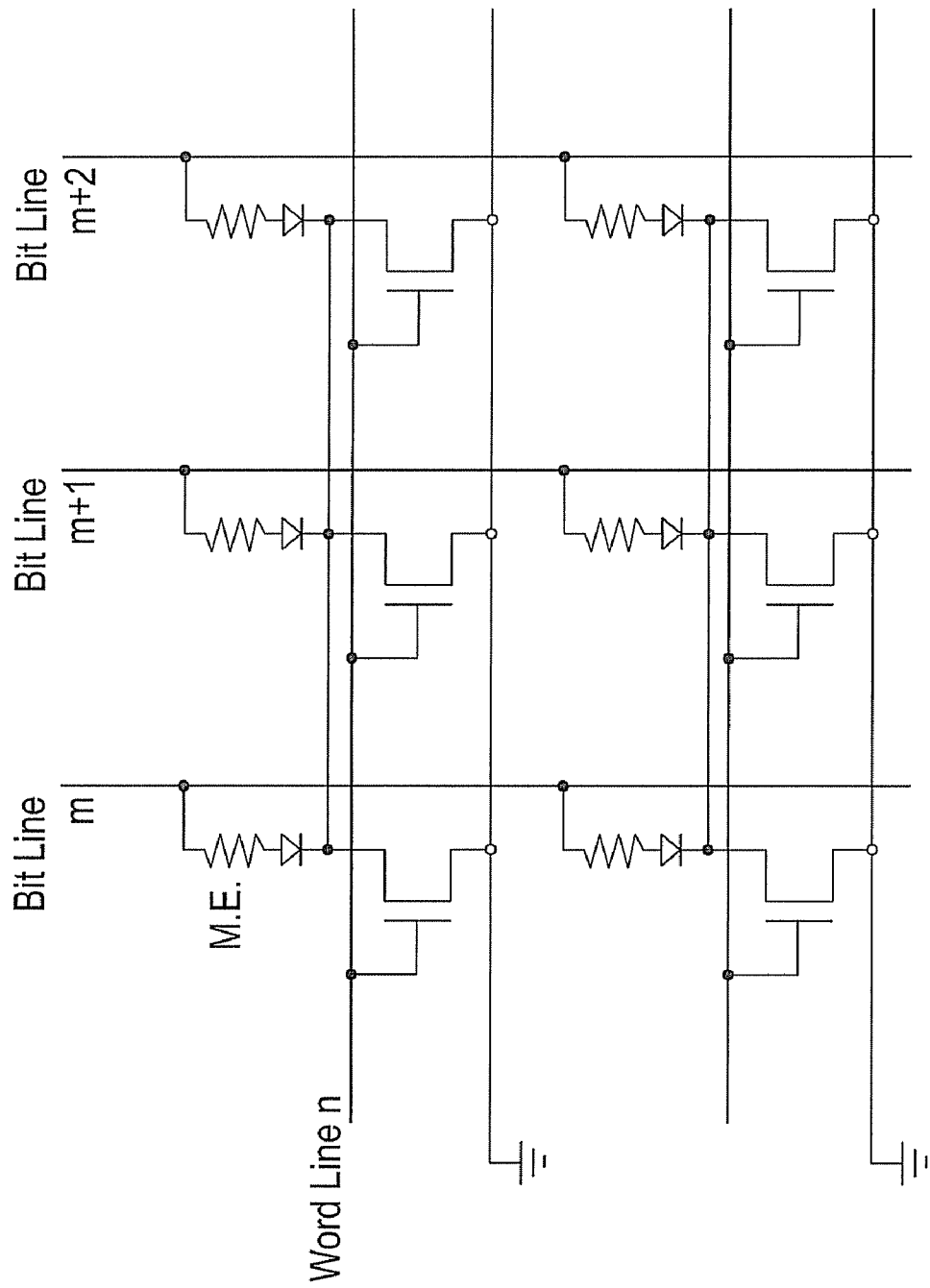
FIG. 5 is a schematic perspective partial view of a nonvolatile memory array with resistive memory elements with pooled transistor drive currents achieved by shorting multiple neighboring cells on different bit lines according to an embodiment of the present invention.

In a further embodiment of the invention, multiple neighboring memory cells on different bit lines can be shorted. By shorting a quantity q of neighboring memory cells together (where q is larger than two), the current through an addressed memory element is approximately q times larger than what each access transistor can drive on its own. FIG. 5 illustrates an instance where three access transistors are shorted. In this case, only every third bit line can be addressed simultaneously, which affects memory granularity. In addition, the readout process combines three currents, and supports all three combinations:

$$I_m-(I_{m+1}+I_{m+2})$$

$$I_{m+1}-(I_m+I_{m+2})$$

$$I_{m+2}-(I_m+I_{m+1}).$$

While the preferred embodiments to the invention have been described, it will be understood that those skilled in the art, both now and in the future, may make various improvements and enhancements which fall within the scope of the claims which follow. These claims should be construed to maintain the proper protection for the invention first described.

The invention claimed is:

1. A method for forming a memory structure, the method comprising:
    forming an array of individual memory cells arranged in a network of bit lines and word lines, each individual memory cell further comprising a resistive memory device that is capable of being programmed to a plurality of resistance states, each of the resistive memory devices coupled to one of the bit lines at a first end thereof;
    configuring a rectifying element in series with each of the resistive memory devices at a second end thereof;
    configuring a plurality of access transistors such that each of the plurality of access transistors is coupled to a rectifying element, the access transistors activated by a signal applied to a corresponding one of the word lines, with each access transistor connected in series with a corresponding rectifying element; and
    forming, after configuring the plurality of access transistors, a common connection configured to short neighboring access transistors together along a word line direction, in groups of two or more, such that current passing through any single rectifying element passes through two or more access transistors.

2. The method of claim 1, wherein the rectifying element is a diode.

3. The method of claim 1, wherein the word lines are configured such that when a given one of the word lines is activated, the remaining word lines are deactivated.

4. The method of claim 1, wherein the bit lines are configured such that each access transistor is connected to at most one forward biased rectifying element.

5. The method of claim 1, wherein during a programming operation of a given resistive memory device, two or more neighboring access transistors are used to pass programming current through the resistive memory device.

6. The method of claim 5, wherein during a read operation of a given resistive memory device, two or more neighboring bit lines are used to sense current passed through the resistive memory device.

7. The method of claim 6, wherein an interval between bit lines available for data access is determined by the number of successive access transistors that are electrically connected.

8. The method of claim 1, wherein the resistive memory device is a phase change element.

9. The method of claim 1, wherein the resistive memory device is at least one of the following: a ferroelectric, a perovskite, solid electrolytes, or molecular switches.

10. A memory structure, comprising:
- an array of individual memory cells arranged in a network of bit lines and word lines, each individual memory cell further comprising a resistive memory device that is capable of being programmed to a plurality of resistance states, each of the resistive memory devices coupled to one of the bit lines at a first end thereof;
- a rectifying element in series with each of the resistive memory devices at a second end thereof, the rectifying element having a output;
- a plurality of access transistors arranged such that each of the access transistors is coupled to the output of two different rectifying elements, the access transistors activated by a signal applied to a corresponding one of the word lines; and
- a common connection configured to short neighboring access transistors together along a word line direction, in groups of two or more;
- wherein a current passing through any rectifying element passes through two or more access transistors.

11. The structure of claim 10, wherein the rectifying element is a diode.

12. The structure of claim 10, wherein the word lines are configured such that when a given one of the word lines is activated, the remaining word lines are deactivated.

13. The structure of claim 10, wherein the bit lines are configured such that each access transistor is connected to at most one forward biased rectifying element.

14. The structure of claim 10, wherein the resistive memory device is a phase change element.

15. The structure of claim 10, wherein the resistive memory device is at least one of the following: a ferroelectric, a perovskite, solid electrolytes, or molecular switches.

* * * * *